(12) United States Patent
Labelle et al.

(10) Patent No.: US 6,793,765 B1
(45) Date of Patent: Sep. 21, 2004

(54) SITU MONITORING OF MICROLOADING USING SCATTEROMETRY WITH VARIABLE PITCH GRATINGS

(75) Inventors: Catherine B. Labelle, San Jose, CA (US); Bhanwar Singh, Morgan Hill, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 119 days.

(21) Appl. No.: 10/230,739

(22) Filed: Aug. 29, 2002

(51) Int. Cl.[7] .................. H05H 1/00; H01L 21/00
(52) U.S. Cl. .................. 156/345.24; 156/345.25; 438/7; 438/9
(58) Field of Search ............ 156/345.24, 345.25, 156/345.26, 345.27, 345.28; 118/712; 438/5, 9, 16; 216/59, 60

(56) References Cited

U.S. PATENT DOCUMENTS

| | | | | |
|---|---|---|---|---|
| 5,685,942 A | * | 11/1997 | Ishii | 156/345.48 |
| 5,910,011 A | * | 6/1999 | Cruse | 438/16 |
| 5,971,591 A | * | 10/1999 | Vona et al. | 700/220 |
| 6,440,760 B1 | * | 8/2002 | Cho et al. | 438/16 |
| 6,455,437 B1 | * | 9/2002 | Davidow et al. | 438/710 |
| 2003/0003607 A1 | * | 1/2003 | Kagoshima et al. | 438/14 |
| 2003/0052084 A1 | * | 3/2003 | Tabery et al. | 216/59 |

* cited by examiner

Primary Examiner—Parviz Hassanzadeh
(74) Attorney, Agent, or Firm—Amin & Turocy, LLP

(57) ABSTRACT

One aspect of the present invention relates to a system for determining and controlling a microloading effect in order to achieve desired feature depth on a wafer. The system includes a semiconductor structure having one or more layers formed over a substrate, a fabrication process assembly for forming features on the semiconductor structure, a microloading characterization system for monitoring the fabrication process, measuring feature depth, and for processing the measurements in order to ascertain the microloading effect, a detection apparatus operatively coupled to the microloading characterization system to facilitate monitoring the fabrication process and measuring feature depth, and a control system for regulating the fabrication process based on the output from the microloading characterization system. Thus, forming features having a first density and features having a second density on the same layer may be formed using one photomask since fabrication parameters can be adjusted based on the determined microloading effect.

29 Claims, 8 Drawing Sheets

US 6,793,765 B1

SITU MONITORING OF MICROLOADING USING SCATTEROMETRY WITH VARIABLE PITCH GRATINGS

TECHNICAL FIELD

The present invention generally relates to processing a semiconductor substrate. In particular, the present invention relates to measuring both dense and isolated gratings during fabrication in order to determine dense and isolated trench depths to facilitate ascertaining and controlling the microloading effect for an etch process.

BACKGROUND ART

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller feature sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the photo mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through the photomask causes the image area to become either more or less soluble (depending on the coating) in a particular solvent developer. The more soluble areas are removed in the developing process to leave the pattern image in the coating as less soluble polymer.

Conventional logic devices and flash memory cells allow for a high packing density. Each cell or device may include a core region surrounded by a peripheral region. The core and peripheral regions usually include a series of transistors and source to drain pathways which involve forming dense as well as isolated trench regions. An example of a common transistor found in flash memory cells is a metal oxide semiconductor (MOS) transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer.

Furthermore, because shallow trench isolation (STI) has been gradually replacing LOCOS in fabrication of logic devices and memory devices due to its improved utilization of real estate, these products usually include both isolated and dense feature arrays. The combined use of isolated and dense features formed in the core and peripheral regions necessitates the employment of at least two masks in order to achieve the desired trench depths. However, isolated trenches tend to etch faster than those in a dense array. This phenomenon is known as the microloading effect and occurs because more etchant species are consumed locally when etching a larger exposed substrate unit area. In addition, the effect is due to the increasing difficulty to bring etching gases into the narrow-deep structures and to evacuate the etched by-products from the structures.

Typically, these trench depths cannot be measured without breaking the wafer for a cross-sectional inspection by a scanning electron microscope (SEM) or some other endpoint detection system. Thus, the wafer is wasted resulting in lost resources and higher production costs as well as decreased fabrication efficiency.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides a system and method for determining the microloading effect in situ a given etch process during fabrication of a semiconductor device wafer. More specifically, the present invention provides a system and method for measuring trench depths associated with isolated and dense feature arrays formed on a product wafer during fabrication of the wafer in order to control microloading and to achieve desired trench depths. This is accomplished in part by monitoring the trench depths of the isolated and dense feature arrays as they are being formed using a scatterometry system. The scatterometry system can be programmed to measure both isolated and dense gratings which correspond to the isolated and dense trench arrays being measured.

By measuring the trench depths, the microloading effect for the particular etch process can be quantified. Thus, the required use of two or more masks for both dense (e.g., core) and isolated (e.g., periphery) areas can be avoided and/or reduced to one mask (or fewer masks) since the microloading effect can be controlled to a desired specification. Therefore, better process control between wafer to wafer and lot to lot is facilitated and obtainable.

One aspect of the present invention relates to a system for determining a microloading effect on a wafer during wafer fabrication. The system includes a semiconductor structure having one or more layers formed over a substrate, the structure being prepared to undergo a fabrication process; a fabrication process assembly for forming one or more features in the semiconductor structure; a microloading characterization system for monitoring the fabrication process assembly, for measuring feature depth, and for processing the measurements in order to determine the microloading effect, the microloading characterization system operable to provide output based on data from a detection apparatus, the detection apparatus being operatively coupled to the microloading characterization system; and a control system for regulating the fabrication process based on the output from the microloading characterization system.

Another aspect of the present invention relates to a system for determining and accommodating for a microloading effect on a wafer layer having isolated and dense features formed therein. The system includes a microloading characterization system which contains a process system for fabricating an isolated array of features in a first region of a semiconductor structure and a dense array of features in a second region of the semiconductor structure, the first region having a first density and the second region having a second density, wherein the first density is less than the second density; a feature depth measurement and monitoring system comprising a detection apparatus for monitoring formation and for measuring feature depth of the arrays; and a processor coupled to the feature depth measurement and monitoring system for collecting and computing the data related to the measured feature depths in order to facilitate determining the microloading effect exhibited by the features. The system further includes a depth control system operatively connected to the processor to receive output relating to the microloading effect from the processor to thereby control one or more feature depth parameter components.

Yet another aspect of the present invention relates to a method for quantifying a microloading effect in situ for a particular process. The method involves providing a semiconductor substrate having at least one layer formed thereon; etching an array of isolated features in a first portion of the layer, the first portion of the layer having a first density; etching an array of dense features in a second portion of the layer, the second portion of the layer having a second density, wherein the first density is less than the second density; and measuring a first depth corresponding to the array of isolated features in the first portion and a second depth corresponding to the array of dense features in the second portion in order to determine the microloading effect.

DISCLOSURE OF INVENTION

Figure 1:
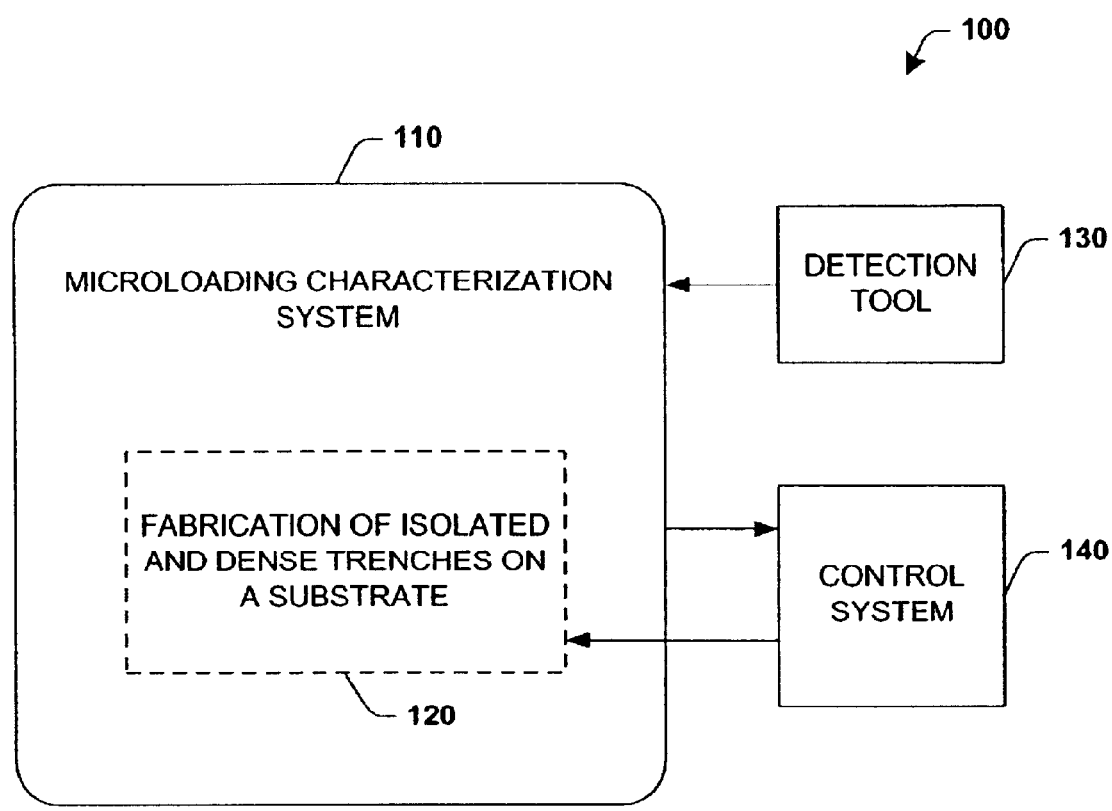
FIG. 1 illustrates a schematic, high-level block diagram of a system for determining the microloading effect in situ a wafer fabrication process in accordance with an aspect of the present invention.

The present invention involves a system and method for determining and accommodating for a microloading effect in situ a fabrication process. In particular, the present invention provides a system and method for determining a microloading effect which can occur when both isolated and dense feature arrays are formed on a semiconductor layer of material using a single photomask. Conventional methods typically require the use of two photomasks in order to achieve the desired depths of the isolated and dense features. By controlling the microloading effect for a fabrication process, the desired depths of isolated and dense features can be achieved without the use of two photomasks.

Determining the microloading effect may be accomplished in part by measuring the depth of the isolated and dense feature arrays being formed on the layer. Such measurements may be taken by a scatterometry system. More specifically, during fabrication of these isolated and dense feature arrays, a scatterometer having variable pitch gratings directs light at the isolated and dense features. The reflected light is collected and processed in order to compute the depth measurements of the isolated and dense feature arrays.

According to one aspect of the present invention, these measurements can be further analyzed in order to quantify the microloading effect associated with an array of isolated features. Data relating to the amount of microloading can be fed back into the fabrication process by way of a depth control system, for example. The depth control system regulates and controls components responsible for carrying out the fabrication process. More specifically, the depth control system can regulate the depth of features formed during an etch process by providing input and/or instructions to one or more depth parameter components. Examples of depth parameter components include components for plasma type, pressure, flow rate, temperature, and time duration for the process.

According to another aspect of the present invention, the microloading effect can be quantified and either fed back to the fabrication or fed forward to subsequent fabrication processes, or both. By providing the microloading effect in the form of a value or set of values, subsequent fabrication processes for forming both isolated and dense feature arrays on the same layer of material can be adjusted in order to accommodate or compensate for the microloading effect. That is, because the degree of microloading effect can be calculated and ascertained, the number of photomasks required to form both isolated and dense feature arrays in the same layer is minimized. For instance, in a memory cell having core and periphery regions, an array of isolated features in the periphery region may be formed at the same time as forming a dense array of trenches in the core region using one photomask rather than at least two as required in conventional memory cell fabrication methods. By predetermining the amount of microloading for a particular etch process, one or a fewer number of photomasks than usually required can be employed to form isolated and dense trench arrays in a layer.

Alternatively or in addition, the present invention facilitates obtaining a desired or specified amount of microloading. That is, depending on the application, substantially no microloading may be desired and/or a given amount of microloading may be desired in a particular area of the wafer. For example, a user may desire deeper trench depths in a periphery region of the wafer. The deeper trench depth may be equivalent to about 400 Å of microloading in that area. Therefore, since the microloading effect can be ascertained and controlled, a desired amount (e.g., zero Å or greater than zero Å) of microloading may be achieved in a controlled manner.

The present invention will now be described in further detail in FIGS. 1–9 below with respect to a trench formation process as seen, for example, in memory cell and/or logic device fabrication methods. However, it should be understood and appreciated that the present invention may also apply to other feature formation processes such as those relating to vias, contact holes, plugs, conductive lines, gates, and the like, and such are intended to fall within the scope of the present invention.

Furthermore and in accordance with the present invention, the phrase "isolated feature array" refers to an array of features and/or a grating of isolated features formed in a first portion of a layer or substrate, wherein the first portion has a first density of features. The phrase "dense feature array" refers to an array or grating of features formed in a second portion of the layer or substrate, wherein the second portion has a second density of features formed therein. Moreover, the first density is less than the second density.

FIG. 1 illustrates a high-level, schematic block diagram of a system 100 for determining a microloading effect during formation of feature arrays in core and periphery regions on a substrate in accordance with one aspect of the present invention. The system 100 includes a microloading characterization system 110 which can determine the extent of microloading as it may occur in a process 120 of fabricating isolated and dense trench arrays using a single photomask over a substrate. That is, the microloading characterization system operates to monitor the fabrication process 120 for the presence of microloading. The system 100 also includes a detection apparatus 130 which facilitates the microloading characterization system 110 in monitoring the fabrication process 120.

More specifically, the detection apparatus 130 interacts with the arrays of trenches formed in the core and periphery regions on the substrate in order to yield measurements of them. These measurements can be processed and analyzed by the microloading characterization system 110 in order to determine and/or quantify the microloading present with respect to the arrays. Data from the microloading characterization system can be transmitted to a control system 140. The control system 140 receives the information and determines what adjustments to make to the fabrication process in order to compensate and/or accommodate for the determined microloading effect. By factoring the microloading effect into the trench fabrication process, the desired trench depths can be achieved using only one photomask.

The control system 140 can also be referred to as a feedback control unit such that the microloading effect can be determined and then factored into the trench fabrication process in order to compensate for, negate, and/or achieve a specific amount of microloading. Moreover, the microloading effect may be controlled to a desired specification.

Figure 2:
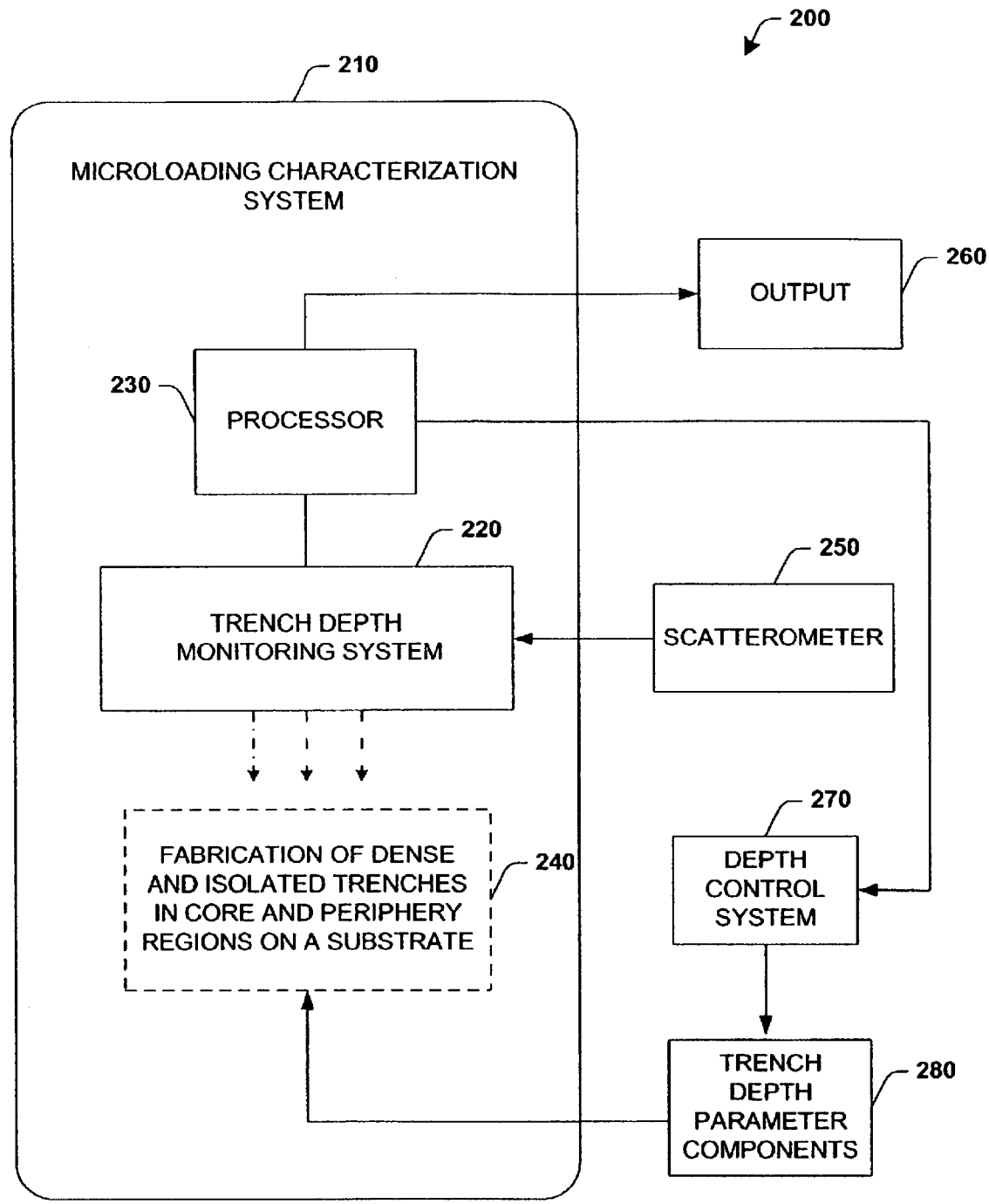
FIG. 2 illustrates a schematic block diagram of a system for determining the microloading effect in accordance with another aspect of the present invention.

FIG. 2 illustrates a schematic block diagram of a system 200 for determining a microloading effect during formation of features in core and periphery regions on a substrate in accordance with another aspect of the present invention. The system 200 includes a microloading characterization system 210 which is similar to the system 110 as described above in FIG. 1. In addition to the qualities of the characterization system 110 described above, the characterization system 210 of FIG. 2 further includes a trench depth monitoring system 220 and a processor 230. The trench depth monitoring system 220 can be programmed to monitor a fabrication process 240 for isolated and dense trench arrays, for example, in the core and periphery regions of a memory cell. This may be accomplished in part by measuring the trench depths during their formation.

In particular, a scatterometer 250 may be employed by the monitoring system 220 in order to facilitate measuring the trench depths. The scatterometer 250 directs a beam of incident light at selected or random locations on the substrate to be measured and the reflected beam of light is detected and collected. The light data may be communicated to the processor 230 for further analysis such as for calculating the microloading effect. According to one aspect of the present invention, the amount of microloading can be determined from analyzing the difference in trench depth between the isolated and the dense trench arrays.

After performing its analysis on the light data, the processor 230 may transmit its findings, conclusions and/or calculations to an output source 260 for further investigation. In addition or alternatively, the processor 230 may communicate all or a portion of its data to a depth control system 270. The depth control system operates to regulate and/or control the trench depths in order to achieve desired trench depths. Therefore, in order to achieve desired trench depths in the trench fabrication process from wafer to wafer, the control system 270 can adjust one or more depth parameter components 280.

By adjusting the depth parameter components 280, the control system 270 compensates for the determined microloading effect such that preferred trench depths (e.g., for STI etch in combination with dense trench array formation) may be achieved when using one photomask. For instance, the preferred trench depths of the isolated and dense arrays depend on the application as well as the desired amount of microloading for each array of features.

Figure 3:
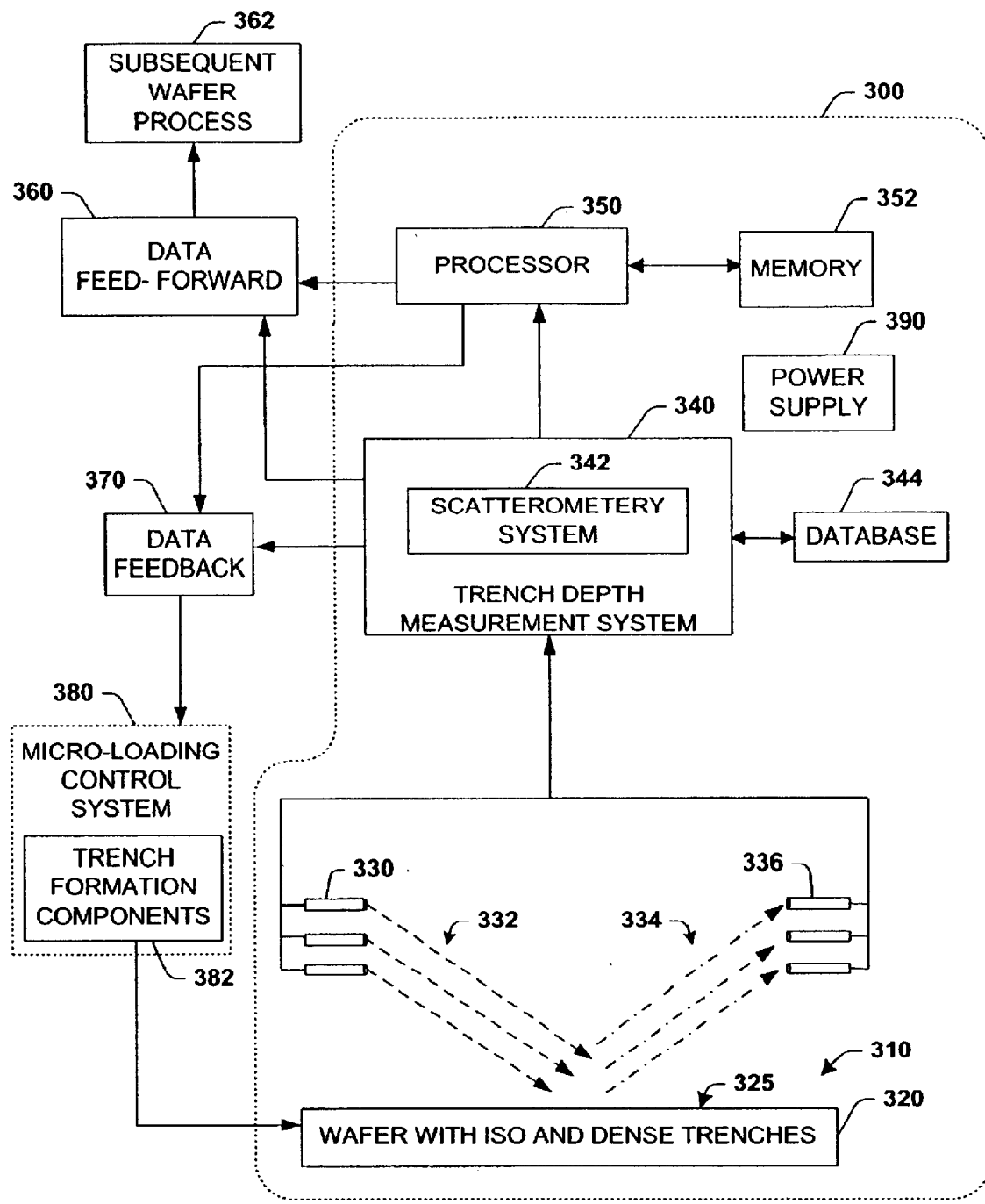
FIG. 3 illustrates a schematic block diagram of a system for quantifying a microloading effect and accommodating for the determined microloading effect in a subsequent wafer process in accordance with an aspect of the present invention.

FIG. 3 demonstrates yet another schematic block diagram of a system 300 for determining and accommodating for a microloading effect particularly during an etch process for forming arrays of isolated and dense features on the same layer of material. In particular, the system 300 ascertains the microloading effect for the etch process and then accommodates for the microloading effect in order to achieve desired depths for both an isolated trench as well as a dense trench array, especially when using only one photomask to form the isolated and dense trenches. The system 300 includes a wafer 310, wherein a layer having arrays of both isolated and dense trenches formed therein is the upper most layer of the wafer 310. The wafer 310 may also include one or more layers underlying the upper most layer.

The wafer 310 is positioned for being monitored as it proceeds through a trench fabrication process. The trench fabrication process involves etching selected portions of the wafer (e.g. portions of core and periphery regions) in order to form both an isolated trench array and a dense trench array using one photomask instead of the usual two photomasks. The system 300 may also be employed to monitor at least a portion of the wafer 310 during and after the trench fabrication process has been completed.

The system 300 also includes a light source 330 which transmits one or more beams of incident light 332 at the wafer 310 and particularly at the surface 325 of the etched layer 320 in order to generate a light scattering signature of the wafer 310. The light scattering signature is a form of data which can be used to determine the microloading effect on the layer 320. Examples of light sources contemplated by the present invention include but are not limited to a laser such as a laser diode or a neon gas laser.

Reflected light 334 from the wafer 310 are received by one or more light receptors 336 in order to generate the light scattering signature of the wafer 310. One or more receptors may be used, examples of which include photo diodes and photo detectors. The incident light 332 and reflected light 334 are communicated to a trench depth measurement system 340. The trench depth measurement system 340 analyzes the incident light 332 and the reflected light 334. The analysis may be performed in conjunction with a scatterometry system 342 in order to interpret the light information for the purpose of generating a light scattering signature corresponding to a trench depth. A spectroscopic ellipsometer may also be used to interpret the light information and is contemplated to fall within the scope of the present invention. Finally, a suitable power supply 390 is employed such as a battery, electrical input, and the like.

The generated light scattering signature characterizes the "appearance" of the wafer 310, particularly the etched layer in order to determine the microloading effect with respect to the wafer 310. The generated light scattering signature can be recorded and/or stored in a database 344 containing the corresponding incident light 332 and reflected light 334 information.

In addition, the measurement system 340 may be coupled to anyone of a plurality of processors 350, such as the AMD K7, and/or similar and compatible processors. The manner in which the measurement system 340 can be programmed to carry out the present invention will be readily apparent to those having ordinary skill in the art based on the description provided herein. The processor 350 may also include a memory 352 which is either internal or external to the processor 350 for storing information, data, and/or measurements corresponding to the current wafer 310 as well as previously processed and future wafers.

The system 300 also can provide feedback and feed-forward control to a trench fabrication process (e.g., FIGS. 1 and 2). More specifically, the system 300 can be operatively and/or indirectly coupled to the trench fabrication process 240 (FIG. 2) to feed back data 370 to a trench control system 380 (e.g., similar to system 270 in FIG. 2) relating to the depths of the trenches being formed on the wafer 310. For example, the trench depth measurement system 340 provides information to facilitate adjusting trench etch components in order to counteract or negate the microloading effect. The determined microloading effect is communicated back to the trench control system 380, where adjustments to the one or more trench depth components 382 can be made and implemented for a future wafer. In addition, the determined microloading effect is fed forward to one or more subsequent wafer processes 362 where the occurrence of microloading effect may influence the formation of structures and features. Moreover, the feedback and feed-forward control provided by the system 300 facilitates achieving desired isolated and dense trench depths while only using one photomask during the etch process. Thus, the microloading effect for arrays of dense and isolated features may be controlled to achieve a desired microloading effect and/or minimized in a controlled manner.

Figure 4:
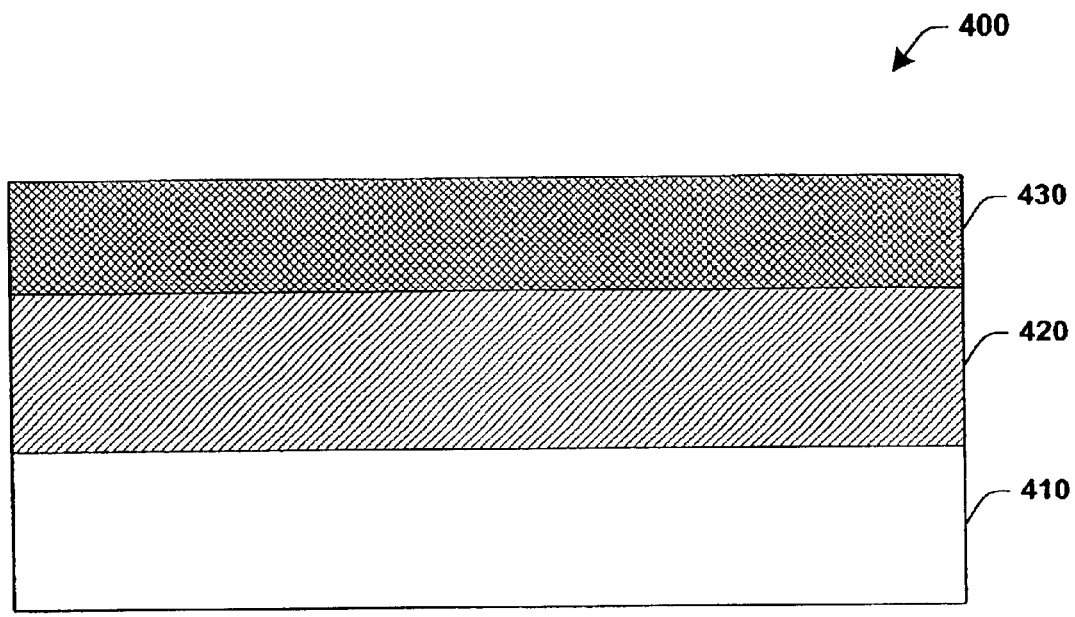
FIG. 4 illustrates a semiconductor structure prepared to undergo a fabrication process.

Turning now to FIG. 4, a semiconductor structure 400 is shown prepared to undergo an etch process in accordance with an aspect of the present invention. The structure 400 includes a substrate 410 made of silicon, polycrystalline silicon, amorphous silicon, or a combination thereof, a layer 420 of any material formed over the substrate 410, and a photoresist layer 430 formed over the intermediate layer 420. The structure 400 may also have a first region and a second region such as a core region and a periphery region.

It should be appreciated that any layer in the structure 400, including the substrate 410, may be etched. In addition, although the layer 420 is illustrated as a single layer of material, it should be understood that one or more layers of material may be formed between the substrate 410 and the overlying photoresist layer 430.

Figure 5:
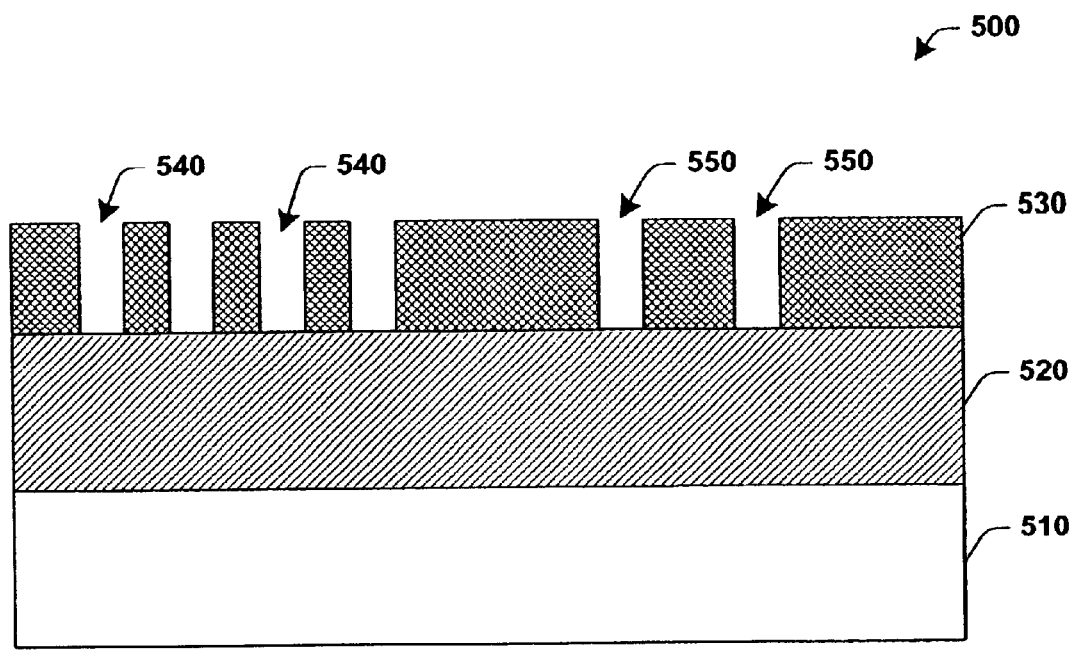
FIG. 5 illustrates a partially fabricated semiconductor structure having isolated and dense features formed in a photomask layer in accordance with an aspect of the present invention.

FIG. 5 illustrates a partially fabricated semiconductor structure 500 having a similar layer arrangement as the structure 400 in FIG. 4. The structure 500 includes a substrate 510, a layer 520 of material, and a patterned photoresist layer 530. The patterned photoresist layer 530 comprises a first 540 and second 550 region. For example, the first region 540 may be referred to as the core region and the second region 550 may be referred to as the periphery region. However, it should be understood that the converse applies as well.

In the present invention, the photoresist 530 has been patterned to reveal a dense trench array at 540 and an isolated trench array at 550 (e.g., STI). Other trench patterns and/or arrays may also be employed and are contemplated to fall within the scope of the present invention.

Figure 6:
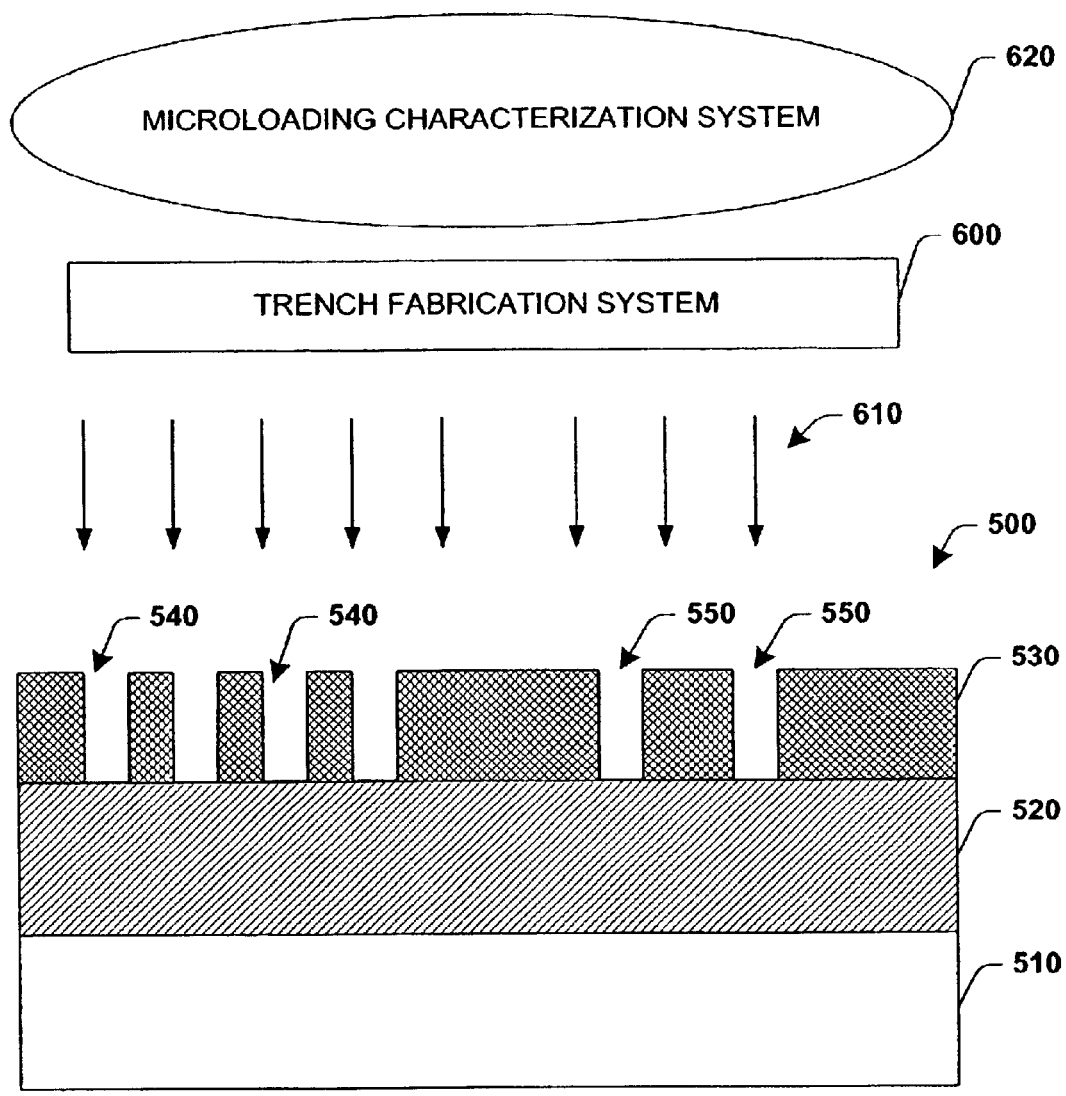
FIG. 6 illustrates the semiconductor structure of FIG. 5 undergoing further processing while being monitored by a microloading characterization system in accordance with an aspect of the present invention.

FIG. 6 depicts the structure 500 as described in FIG. 5 as it is undergoing an etch process by a trench fabrication system 600. In particular, selected portions of the layer 520 are being etched through the openings 540, 550 of the patterned photomask 530. During and/or after trench formation, a microloading characterization system 620 operates to determine a microloading effect with respect to the trenches being formed in order to achieve desired trench depths.

Figure 7:
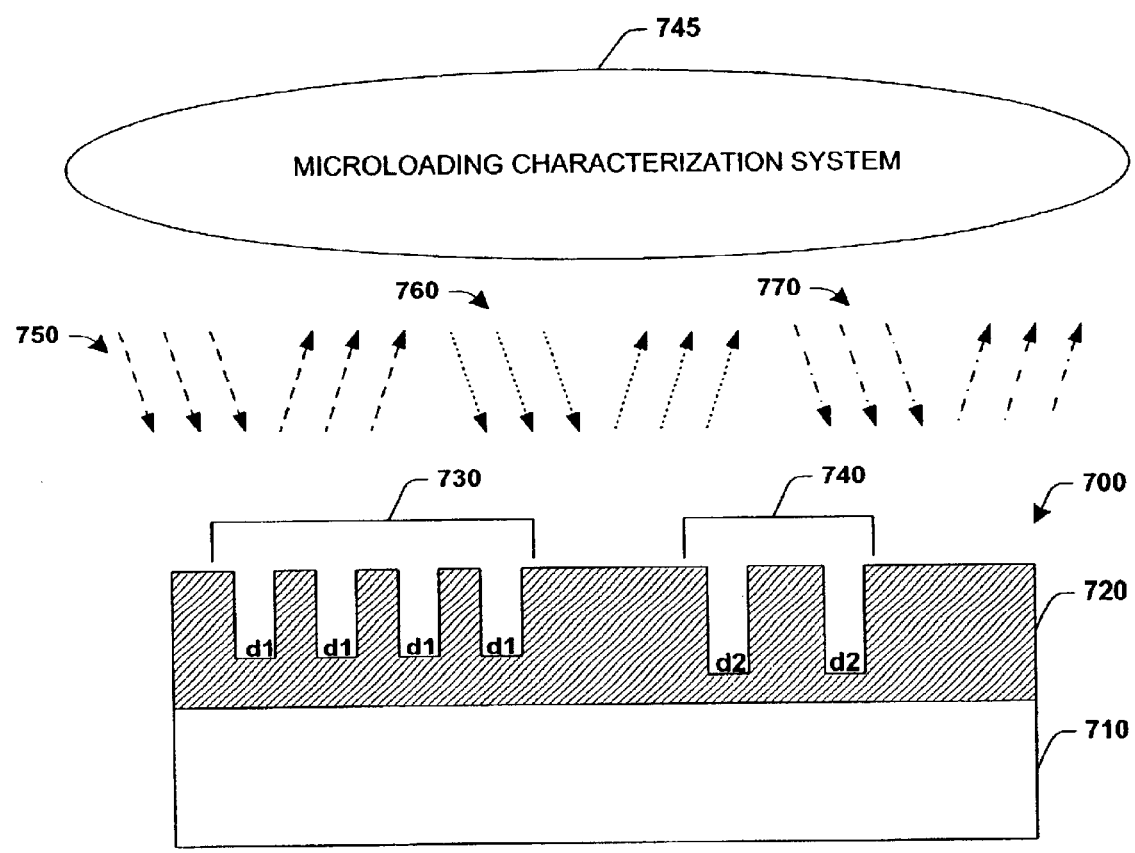
FIG. 7 illustrates the semiconductor structure of FIG. 6 undergoing a measurement process in accordance with an aspect of the present invention.

FIG. 7 illustrates a partially fabricated structure 700 after having undergone a trench etch process as described above in FIG. 6. The structure 700 includes an etched layer 720 over a substrate 710, whereby the layer 720 includes a dense trench array 730 in a first portion of the structure 700 and an isolated trench array 740 in a second portion of the structure 700. As can be seen, the dense trench array 730 exhibits a depth d1 which corresponds to a desired depth. However, the isolated trench 740 has a depth d2, whereby d2 is greater than d1. Thus, the isolated trench array 740 exhibits a microloading effect. This undesirable difference in trench depth can cause device malfunction or nonfunction depending on the conditions and circumstances of its use. Alternatively, a particular amount of microloading may be desirable depending on the user's application. Hence, it would be desirable to control the amount of microloading such that the amount of the effect is predictable and expected to occur.

In order to control the microloading effect shown in FIG. 7 to a specified amount (e.g., about zero Å or a given amount greater than zero Å), a microloading characterization system 745 can be employed as previously described above in FIGS. 1–3 in order to quantify the amount or degree of microloading. Quantification of the microloading effect can be performed by measuring the trench depths using a scatterometer, for example. The scatterometer directs one or more beams of light 750, 760, 770, or at least one beam of light, according to scatterometric techniques over at least a portion of the trench arrays 730, 740. The respective reflected light can then be detected and gathered for analysis. It should be appreciated that either the structure 700 or the characterization system 745 may be mobile in order to perform the light analysis of the layer 720.

Figure 8:
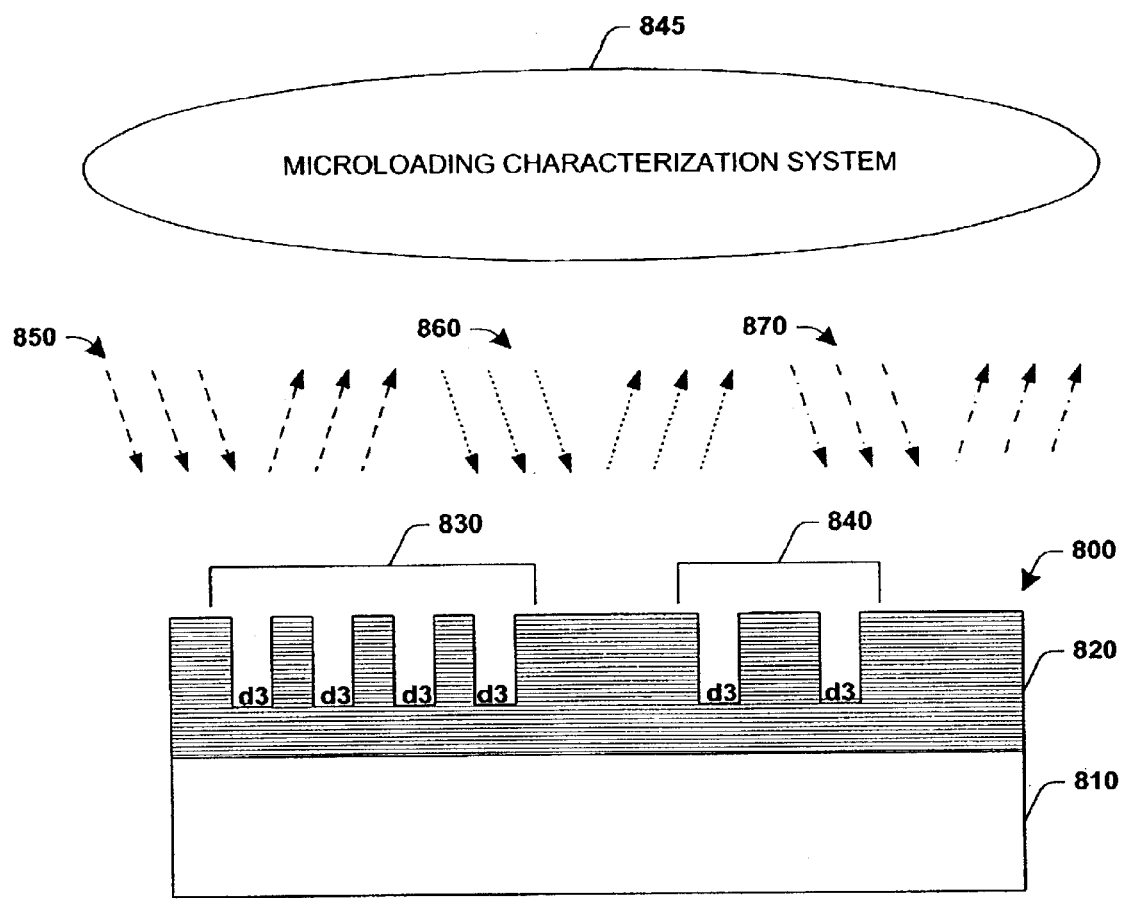
FIG. 8 illustrates an improved semiconductor structure being monitored and inspected by a microloading characterization system in accordance with an aspect of the present invention.

FIG. 8 shows a partially fabricated structure 800 in accordance with an aspect of the present invention. The structure 800 includes a substrate 810 and an etched layer 820 formed there over. The layer 820 has undergone an etch process in order to form a dense trench array 830 and an isolated trench array 840, whereby the trench arrays 830, 840 have achieved a desired depth of d1 while using one photomask to form such trench arrays 830, 840.

As previously discussed, the microloading characterization system 745 (FIG. 7) determines the microloading effect in order to control the amount of microloading for the trench etch process. The microloading effect information can be fed back into the trench fabrication system 600 (FIG. 6) and as a result, adjustments may be made to one or more etch components in order to accommodate for and/or negate the determined microloading effect. Thus, the trench arrays 830, 840 exhibit substantially no microloading. In order to verify that the desired trench depths were achieved, the etch layer 820 may be screened again using a scatterometer. The microloading effect for the structure 800 is substantially mitigated and/or eliminated since the desired trench depths were achieved for both the isolated trench array 840 as well as the dense trench array 830.

Alternatively or in addition, the trench fabrication system may use the determined microloading effect in order to adjust one or more components in order to achieve a controlled amount of microloading in a particular region of the wafer. For example, the components of the trench fabrication system may be adjusted in order to achieve 200 Å of microloading instead of a determined 500 Å of microloading that was measured in a particular trench array (e.g., array 740 in FIG. 7).

Figure 9:
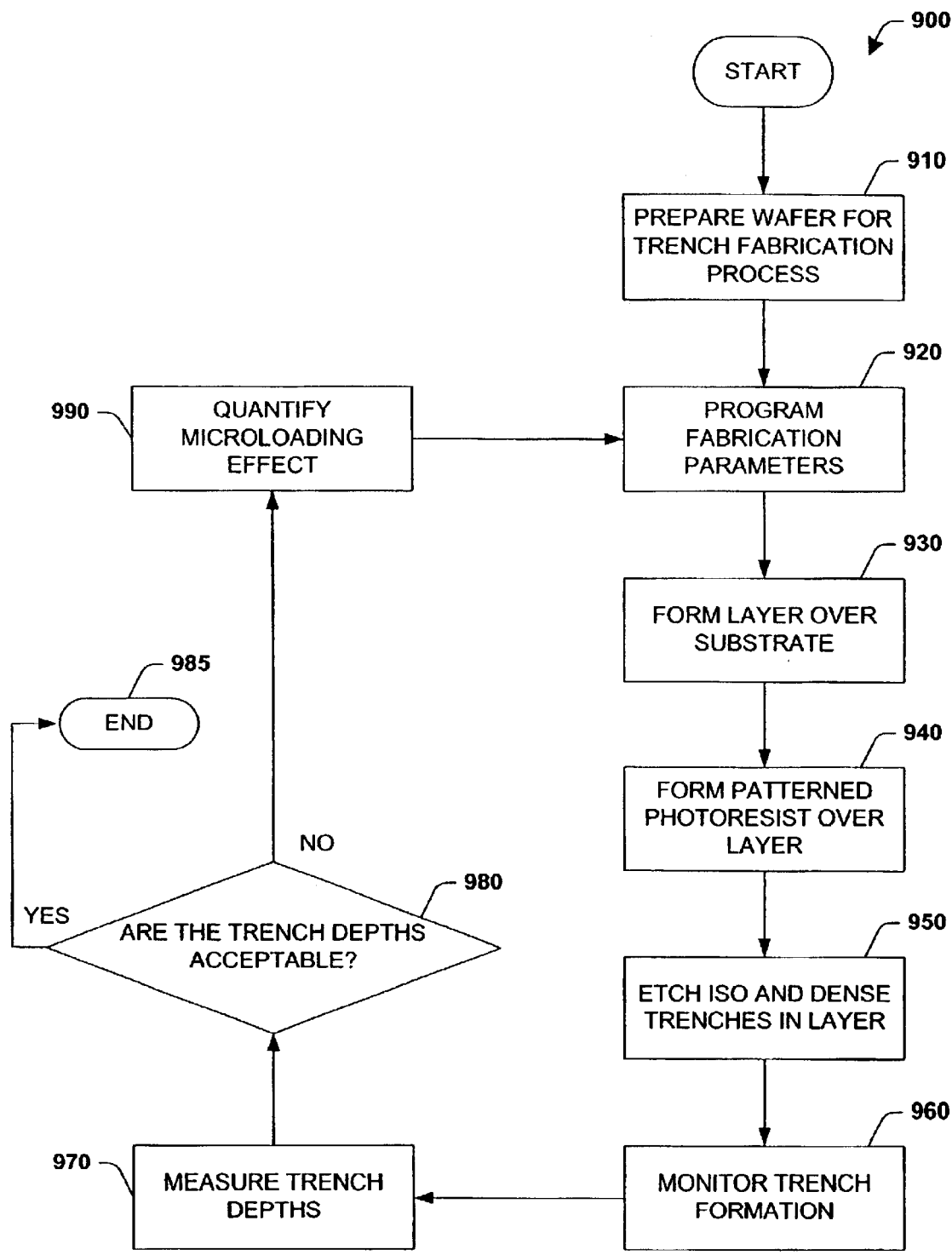
FIG. 9 illustrates a schematic flow diagram of an exemplary method for determining a microloading effect in accordance with an aspect of the present invention.

Referring now to FIG. 9, a schematic flow diagram of an exemplary method 900 for determining and accommodating for a microloading effect according to one aspect of the present invention is shown. More specifically, the exemplary method 900 provides a technique for achieving desired trench depths for an isolated trench (e.g., formed by STI) when formed in conjunction with a dense trench array using one photomask. Recall that conventional methods require the use of at least two photomasks in order to achieve the desired trench depths for both isolated and dense trenches formed on a layer.

The method may begin with general fabrication initializations followed by preparing a wafer to undergo a trench fabrication process at 910. At 920, the fabrication parameters can be set or programmed according to desired trench depths and layer thicknesses, for example, via one or more trench parameter components. A trench control system may be directing the movements of the components in terms of type of layer material to deposit, plasma type, flow rate, pressure, temperature, and duration of the process.

At 930, a layer of material can be formed over or on the substrate (wafer) according to desired specifications. The layer should be of a suitable thickness and material to carry out the present invention. Following, a photoresist (photomask) is formed over the layer and patterned with both isolated trench and dense trench array images (at 940). Using an appropriate etch species, the layer underlying the patterned photoresist may be irradiated at 950 through the openings of the patterned photoresist layer in order to transfer the trench images to the layer.

During and/or after trench formation, a monitoring system may be employed to monitor the trench formation, and in particular, the trench depths in order to determine whether microloading is occurring (at 960). Monitoring of the wafer may be performed by measuring the trench depths using a light-scattering-detection device such as a scatterometry system (at 970). The scatterometry system includes a scatterometer having variable pitch gratings in order to be able to interact with the surfaces of the isolated and densely packed trenches being formed on the wafer.

Once the trench depths are measured for the isolated trench and dense trench arrays, their measurements can be analyzed to determine whether they are acceptable or whether they are indicative of microloading (980). If the trench depths are acceptable, then no undesired or unanticipated microloading effect is present, and the method may end at 985, thereby allowing the wafer to continue onto further processing. However, if the trench depths are not acceptable, then the microloading effect must be determined and/or quantified so that the trench fabrication system can correct the undesirable amount of microloading (990).

After the microloading effect has been determined and calculated to a value, this information can be communicated and/or fed back to the trench fabrication system via the trench control system. The trench control system adjusts the one or more trench parameter components based on the quantified microloading effect in order to accommodate for its occurrence. Thus, because the microloading effect can be determined and factored into the trench fabrication parameters, one photomask may be sufficient to achieve desired isolated and dense trench depths. Furthermore, controlled microloading may be achieved in arrays of isolated and dense features where it is desired to form features of different depths.

Although the invention has been shown and described with respect to several aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A system for determining and controlling a microloading effect in order to achieve desired isolated and dense feature depth on a wafer during feature fabrication comprising:

a semiconductor structure having one or more layers formed over a substrate;

a fabrication process assembly for forming one or more features in the semiconductor structure;

a microloading characterization system for monitoring the fabrication process assembly, for measuring feature depth, and for processing the measurements in order to determine the microloading effect, the microloading characterization system operable to provide output based on data from a detection apparatus, wherein the detection apparatus is operatively coupled to the microloading characterization system and the output from the microloading characterization system comprises numerical data and calculated values relating to an amount of microloading on the semiconductor structure; and a control system for regulating the fabrication process based on the output from the microloading characterization system.

2. The system of claim 1, wherein the fabrication process assembly is operable to form one or more features having a first density in a first portion of the semiconductor structure and one or more features having a second density in a second portion of the semiconductor structure, wherein the first density is less than the second density.

3. The system of claim 1, wherein the detection apparatus is a scatterometry system comprising a scatterometer having variable pitch gratings.

4. The system of claim 1, wherein the control system regulates the fabrication process by adjusting one or more fabrication process components based on the output from the microloading characterization system.

5. The system of claim 4, wherein the one or more fabrication process components includes plasma type, pressure, flow rate, temperature, power, and exposure time.

6. The system of claim 1, wherein the output from the microloading characterization system is fed back to the fabrication process assembly to facilitate accommodating for the determined microloading effect.

7. The system of claim 1, wherein the output from the microloading characterization system is fed forward to a subsequent fabrication process to facilitate forming isolated and dense features on a layer of a subsequent wafer such that microloading on the layer is substantially mitigated.

8. The system of claim 1, wherein the microloading characterization system comprises a processor for computing data detected by the detection apparatus.

9. A method for determining and controlling a microloading effect in situ an etch process using the system of claim 1 comprising:
   providing a semiconductor substrate having at least one layer formed thereon;
   etching an array of isolated features in a first portion of the layer, the first portion of the layer having a first density;
   etching an array of dense features in a second portion of the layer, the second portion of the layer having a second density, wherein the first density is less than the second density; and
   measuring a first depth corresponding to the array of isolated features in the first portion and a second depth corresponding to the array of dense features in the second portion in order to determine the microloading effect.

10. The method of claim 9, wherein the first portion and the second portion of the layer are any one of a periphery region and a core region.

11. The method of claim 9, wherein measuring the first and second depths comprises directing at least one incident beam of light toward at least a first location on the layer and collecting at least one reflected beam of light at one or more light sensors in order to facilitate monitoring the depth of the isolated feature and of the dense feature array being formed in the layer.

12. The method of claim 9, further comprising analyzing the depth measurements using a processor to calculate the microloading effect in order to facilitate accommodating for the determined microloading effect for subsequent wafers.

13. The method of claim 9, wherein the etching of the arrays of the isolated and the dense features is performed by an etch process via one or more components.

14. The method of claim 9, further comprising feeding data corresponding to the determined microloading effect back to the etch process so as to effect a change in one or more feature components in order to mitigate the microloading effect on future wafers.

15. The method of claim 9, further comprising feeding data corresponding to the determined microloading effect forward to subsequent fabrication processes in order to mitigate microloading on future wafers.

16. The method of claim 9, further comprising feeding data corresponding to the determined microloading effect back to the etch process so as to effect a change in one or more feature components in order to control an amount of microloading on future wafers.

17. The method of claim 9, further comprising feeding data corresponding to the determined microloading effect forward to subsequent fabrication processes in order to control an amount of microloading on future wafers.

18. The method of claim 9, wherein the output from the microloading characterization system is fed forward to a subsequent fabrication process to facilitate forming isolated and dense features on a layer of a subsequent wafer such that microloading an the layer is substantially controlled to obtain a specified amount of microloading.

19. A system for determining and controlling a microloading effect on a wafer layer having isolated and dense features formed therein, the system comprising:
   a microloading characterization system comprising:
      a process system for fabricating an isolated array of features in a first region of a semiconductor structure and a dense array of features in a second region of the semiconductor structure, the first region having a first density and the second region having a second density, wherein the first density is less than the second density;
      a feature depth measurement and monitoring system comprising a detection apparatus for monitoring formation and for measuring feature depth of the arrays; and
      a processor coupled to the feature depth measurement and monitoring system for collecting and computing the data related to the measured feature depths in order to facilitate determining the microloading effect exhibited by the arrays; and
      a depth control system operatively connected to the processor to receive output relating to the microloading effect from the processor to thereby control one or more feature depth components, wherein the output from the microloading characterization system comprises numerical data relating to an amount of microloading on the semiconductor structure.

20. The system of claim 19, wherein the detection apparatus is a scatterometry system comprising a scatterometer having variable pitched gratings.

21. The system of claim 19, wherein the depth control system regulates the process system by adjusting one or more depth components based on the output from the microloading characterization system.

22. The system of claim 19, wherein the one or more depth components includes plasma type, pressure, flow rate, temperature, power, and exposure time.

23. The system of claim 19, Wherein the output from the microloading characterization system is fed back to the process system to facilitate accommodating for the microloading effect.

24. The system of claim 19, wherein the output from the microloading characterization system is fed forward to a subsequent fabrication process to facilitate forming isolated and dense features on a layer of a subsequent wafer such that microloading on the layer is substantially mitigated.

25. The system of claim 19, wherein the output from the microloading characterization system is fed forward to a subsequent fabrication process to facilitate forming arrays of isolated and dense features on a layer of a subsequent wafer such that microloading on the layer is substantially controlled to obtain a specified amount of microloading.

26. The system of claim 19, wherein the output from the microloading characterization system is fed back to the process system to facilitate controlling an amount of the microloading effect which is to occur.

27. The system of claim 19, wherein the isolated array of features in the first portion and the dense array of features in the second portion comprise trenches.

28. The system of claim 19, wherein the first portion and the second portion of the layer are any one of a core and a periphery region.

29. The system of claim 19, further comprising a database coupled to feature depth measurement and monitoring system for storing data collected by the detection apparatus.

* * * * *